United States Patent
Ego

(10) Patent No.: US 10,216,238 B2
(45) Date of Patent: Feb. 26, 2019

(54) POWER-ON RESET CIRCUIT

(71) Applicant: ROHM CO., LTD., Ukyo-Ku, Kyoto (JP)

(72) Inventor: Hirotsugu Ego, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/787,132

(22) Filed: Oct. 18, 2017

(65) Prior Publication Data

US 2018/0107257 A1 Apr. 19, 2018

(30) Foreign Application Priority Data

Oct. 19, 2016 (JP) .................................. 2016-205453

(51) Int. Cl.
| | |
|---|---|
| *G06F 1/24* | (2006.01) |
| *G06F 1/32* | (2019.01) |
| *H03K 5/24* | (2006.01) |
| *H03K 17/22* | (2006.01) |
| *H03K 19/20* | (2006.01) |
| *G06F 1/26* | (2006.01) |

(52) U.S. Cl.
CPC .................. *G06F 1/24* (2013.01); *G06F 1/26* (2013.01); *G06F 1/32* (2013.01); *H03K 5/24* (2013.01); *H03K 17/22* (2013.01); *H03K 17/223* (2013.01); *H03K 19/20* (2013.01)

(58) Field of Classification Search
CPC .. G06F 1/24; G06F 1/32; H03K 19/20; H03K 5/24; H03K 17/223
See application file for complete search history.

(56) References Cited

U.S. PATENT DOCUMENTS

| | | | |
|---|---|---|---|
| 8,487,673 B2* | 7/2013 | Xiao | .......................... G06F 1/24 |
| | | | 327/143 |
| 8,493,306 B2* | 7/2013 | Lee | ........................... G09G 3/20 |
| | | | 327/143 |
| 2008/0218224 A1* | 9/2008 | Morino | .................. H03K 17/22 |
| | | | 327/143 |

FOREIGN PATENT DOCUMENTS

JP 2016127480 A 7/2016

* cited by examiner

*Primary Examiner* — Jung Kim
(74) *Attorney, Agent, or Firm* — Cantor Colburn LLP

(57) ABSTRACT

A power-on reset circuit is provided to a semiconductor device including a first power supply pin and N (N≥1) second power supply pins. A voltage monitoring circuit is configured with a voltage at the first power supply pin as its power supply, and compares each of the voltages supplied to the N second power supply pins with a corresponding threshold value. When the supplied voltage exceeds the corresponding threshold value for all the second power supply pins, the voltage monitoring circuit asserts a trigger signal TRIG. A reset signal generating circuit is configured with the voltage at the first power supply pin as its power supply. The reset signal generating circuit asserts a reset signal POR_OUT in response to assertion of the trigger signal TRIG.

17 Claims, 7 Drawing Sheets

POWER-ON RESET CIRCUIT

CROSS REFERENCE TO RELATED APPLICATION

The present invention claims priority under 35 U.S.C. § 119 to Japanese Patent Application No. 2016-205453 filed on Oct. 19, 2016, the entire content of which is incorporated herein by reference.

BACKGROUND OF THE INVENTION

1. Field of the Invention

The present invention relates to a power-on reset circuit.

2. Description of the Related Art

Semiconductor devices such as ICs (Integrated Circuits), LSIs (Large Scale Integrated Circuits), CPUs (Central Processing Units), DSPs (Digital Signal Processors), etc., are driven using a power supply voltage received from an external circuit. In a case in which the power supply voltage becomes insufficient, this leads to unstable operation of a power-receiving circuit. In some cases, this leads to abnormal operation thereof. In order to solve such a problem, in many cases, such semiconductor devices mount a power-on reset (POR: Power On Reset) circuit.

When the power supply voltage is lower than a predetermined threshold value (release voltage), the POR circuit sets the power-receiving circuit to a suspension state (power-down state) such that the power-receiving circuit does not operate so as to prevent unnecessary power consumption. Furthermore, the POR circuit resets the registers, memory, etc. that are internal components of the power-receiving circuit. When the power supply voltage exceeds the threshold value, the POR circuit releases the suspension state of the power-receiving circuit, and/or releases the reset states of the registers, etc. Furthermore, the POR circuit starts the operation of the power-receiving circuit.

Semiconductor devices are known, each configured to receive multiple power supply voltages. For example, an analog/digital hybrid device includes an analog block and a digital block as the power-receiving circuits. Such an analog/digital hybrid device receives the power supply voltage to be supplied to the analog block and the power supply voltage to be supplied to the digital block via different power lines.

There are several conceivable approaches as a method for resetting such a semiconductor device.

One approach is as follows. That is to say, the start-up sequence of the multiple power supply voltages is defined in specifications. When the POR circuit has detected that the multiple power supply voltages have been started up according to the sequence defined in the specifications, the POR circuit executes a reset operation. With this approach, the start-up sequence of the multiple power supply voltages is restricted to a particular sequence. This requires a complicated power supply circuit to be designed, and requires a complicated timing control operation.

Also, another approach is conceivable. That is to say, a reset pin is provided to such a semiconductor device. The semiconductor device is reset according to a signal supplied to the reset pin. This approach has an advantage of relaxing the restriction on the start-up sequence of the multiple power supply voltages. However, there is a need to supply a reset signal to the semiconductor device from a power supply circuit or otherwise a CPU. This leads to a problem of an increased number of pins and an increased wiring area.

SUMMARY OF THE INVENTION

The present invention has been made in order to solve such a problem. Accordingly, it is an exemplary purpose of an embodiment of the present invention to provide a power-on reset circuit that is capable of relaxing a restriction on a start-up sequence of multiple power supply voltages in a semiconductor device that receives the supply of the multiple power supply voltages.

An embodiment of the present invention relates to a power-on reset circuit provided to a semiconductor device comprising a first power supply pin and N (N is equal to or greater than 1) second power supply pins. The power-on reset circuit comprises a voltage monitoring circuit and a reset signal generating circuit. The voltage monitoring circuit is structured to operate with a voltage at the first power supply pin as a power supply thereof, to compare each from among voltages supplied to the N second power supply pins with a corresponding threshold value, and to assert a trigger signal when the supplied voltage exceeds a corresponding threshold value for all the second power supply pins. The reset signal generating circuit is structured to operate with the voltage at the first power supply pin as a power supply thereof, and to assert a reset signal in response to an assertion of the trigger signal.

After the voltage supply has been started up for all of the first power supply pin and the N second power supply pins, such an embodiment is capable of asserting a reset signal regardless of the order in which the power supply voltages have been started up.

Also, the voltage monitoring circuit may further comprise N voltage comparators that correspond to the respective N second power supply pins, and that are each structured to compare a power supply voltage at the corresponding second power supply pin with a corresponding threshold value. Also, N may be equal to or greater than 2. Also, the voltage monitoring circuit may further comprise a logic circuit structured to generate the trigger signal that corresponds to outputs of the N voltage comparators.

Also, the N voltage comparators may each comprise an open-drain output stage or otherwise an open-collector output stage. Also, the logic circuit may comprise a current source or otherwise an impedance circuit coupled to a common output node of the outputs of the N voltage comparators, and may be structured to generate the trigger signal that corresponds to an output of the common output node of the N voltage comparators.

The reset signal generating circuit may be provided with filter characteristics or delay characteristics. This provides the circuit with improved stability.

Also, the reset signal generating circuit may be provided with hysteresis characteristics. With such an arrangement, in the voltage monitoring circuit, each voltage comparator is not required to have hysteresis characteristics. This allows a simple circuit configuration.

Also, the reset signal generating circuit may comprise a CR time constant circuit. This is capable of detecting whether or not an assertion of the trigger signal continues for a predetermined period of time.

Also, the reset signal generating circuit may comprise: a first node; a second node; a first resistor provided between a power supply line coupled to the first power supply pin and the first node; a second resistor provided between the power supply line and the second node; a capacitor provided between the first node and a ground; a first transistor coupled with the capacitor in parallel between the first node and the ground, and structured to receive the trigger signal via a control terminal thereof; a second transistor provided with a third resistor coupled in series between the first node and the ground, and arranged such that a control terminal thereof is coupled to the second node; a third transistor provided between the second node and the ground, and arranged such that a control terminal thereof is coupled to the first node; and an output circuit structured to generate the reset signal that corresponds to a voltage at the first node.

Also, the output circuit may further comprise a Schmitt buffer structured to receive the voltage at the first node. This provides hysteresis characteristics.

Also, the output circuit may further comprise: an inverter structured to receive a voltage at the second node; and an AND gate structured to generate a logical AND of an output of the inverter and an output of the Schmitt buffer. Such an arrangement is capable of fixing the reset signal when the supply of the voltage to the first power supply pin is started up.

Also, N may be equal to or greater than 2. Also, the N threshold values corresponding to the N second power supply pins may be equal to each other. Also, the power-on reset circuit may comprise a fourth resistor and a current source provided in series between a power supply line coupled to the first power supply pin and a ground. Also, a voltage at a connection node that connects the fourth resistor and the current source may be used as the common threshold value.

Also, the current source may comprise an N-channel MOSFET arranged such that a source thereof is grounded and a gate and a drain thereof are coupled. In this case, the current source is capable of generating a current that corresponds to the size (W/L) of the N-channel MOSFET.

Another embodiment of the present invention relates to a semiconductor device. The semiconductor device may comprise any one of the aforementioned power-on reset circuits.

Yet another embodiment of the present invention also relates to a semiconductor device. The semiconductor device comprises: a first power supply pin; N (N is equal to or greater than 1) second power supply pins; an interface circuit structured to operate receiving a voltage at the first power supply pin; N power-receiving circuits provided corresponding to the N second power supply pins; a power-on reset circuit structured to assert a reset signal when a predetermined voltage is supplied to all the first power supply pin and the N second power supply pins; a first buffer structured to supply the reset signal to the interface circuit; and N second buffers structured to supply the reset signals to the N power-receiving circuits. The power-on reset circuit comprises: a voltage monitoring circuit structured to operate with a voltage at the first power supply pin as a power supply thereof, to compare the voltage supplied to each of the N second power supply pins with a corresponding threshold value, and to assert a trigger signal when the supplied voltage exceeds the corresponding threshold value for all the second power supply pins; and a reset signal generating circuit structured to operate with the voltage at the first power supply pin as a power supply thereof, and to assert a reset signal when an assertion of the trigger signal continues for a predetermined period of time.

Also, the semiconductor device may further comprise: a control pin structured to override the power-on reset circuit; and a test reset pin structured to allow an external reset signal to be received. Also, when the control pin is set to a predetermined electrical state, a signal that corresponds to the external reset signal may be input to the first buffer and the N second buffers instead of inputting the reset signal.

Also, the semiconductor device may be structured as an audio amplifier circuit. Also, the interface circuit may comprise a reception circuit structured to receive a digital audio signal from an external processor. Also, one of the N power-receiving circuits may comprise a digital signal processing circuit structured to perform signal processing for the digital audio signal. Also, another one of the N power-receiving circuits may comprise a D/A converter structured to convert the digital audio signal subjected to the processing by means of the digital signal processing circuit into an analog audio signal, and an amplifier structured to amplify the analog audio signal.

Yet another embodiment of the present invention relates to an electronic device. The electronic device comprises the aforementioned semiconductor device, and a power supply circuit structured to supply a power supply voltage to the first power supply pin and the N second power supply pins of the semiconductor device.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not substantially affect the electric connection between them, or that does not damage the functions of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions of the connection between them, in addition to a state in which they are directly coupled.

Figure 1:
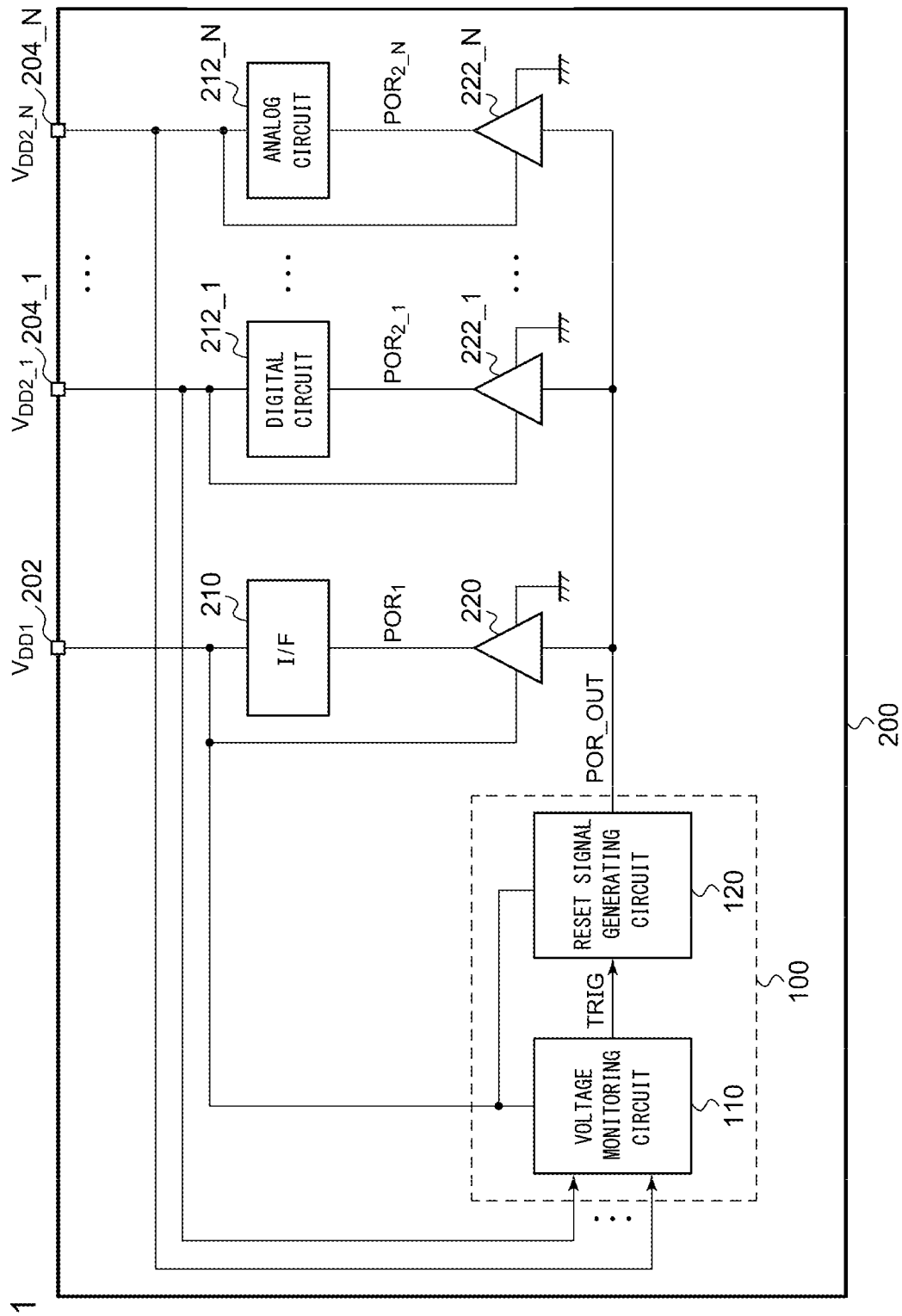
FIG. 1 is a block diagram showing a semiconductor device including a power-on reset circuit according to an embodiment.

FIG. 1 is a block diagram showing a semiconductor device 200 including a power-on reset circuit 100 according to an embodiment. The semiconductor device 200 is provided with a first power supply pin 202 and N (N is an integer of 1 or more) second power supply pins 204. The power supply voltages $V_{DD1}$ and $V_{DD2\_1}$ through $V_{DD2\_N}$ are supplied from an unshown power supply circuit to the first power supply pin 202 and the second power supply pins 204_1 through 204_N.

The semiconductor device 200 includes a power-receiving circuit 210 configured to receive the power supply voltage $V_{DD1}$ via the first power supply pin 202, and N power-receiving circuits 212_1 through 212_N configured to receive the power supply voltages $V_{DD2\_1}$ through $V_{DD2\_N}$ via the N second power supply pins 204_1 through 204_N.

When all the power supply voltages $V_{DD1}$ and $V_{DD2\_1}$ through $V_{DD2\_N}$ exceed a predetermined voltage level, the power-on reset circuit 100 asserts a reset (POR_OUT) signal. A buffer 220 is configured with the power supply voltage $V_{DD1}$ as its power supply, and to supply a $POR_1$ signal based on the POR_OUT signal to the power-receiving circuit 210. Furthermore, the buffers 222_1 through 222_N are configured with the power supply voltages $V_{DD2\_1}$ through $V_{DD2\_N}$ as their power supplies. The i-th buffer 222_i supplies a $POR_{2\_i}$ signal based on the POR_OUT signal to the corresponding power-receiving circuit 212_i. The power-receiving circuit 210 and the power-receiving circuits 212 transit to their operation states in response to assertions of the $POR_1$ signal and the $POR_2$ signals. In addition, the reset states of the internal components thereof such as registers, etc., are released.

The power-on reset circuit 100 includes a voltage monitoring circuit 110 and a reset signal generating circuit 120. The voltage monitoring circuit 110 is configured with the voltage $V_{DD1}$ at the first power supply pin 202 as its power supply. The voltage monitoring circuit 110 compares the voltages $V_{DD2\_1}$ through $V_{DD2\_N}$ supplied to the N second power supply pins 204 with corresponding threshold values $V_{TH2\_1}$ through $V_{TH2\_N}$, respectively. When the voltages $V_{DD2\_i}$ supplied via the second power supply pins 204_i (i=1, 2, . . . , N) all exceed the corresponding threshold values $V_{TH2\_i}$, the voltage monitoring circuit 110 asserts a trigger (TRIG) signal. It should be noted that the voltages to be directly monitored by the voltage monitoring circuit 110 do not include the voltage $V_{DD1}$ at the first power supply pin 202.

It should be noted that the assertions of the POR_OUT signal and the TRIG signal may each be assigned to a desired level, i.e., the high level or low level.

The reset signal generating circuit 120 is configured with the voltage $V_{DD1}$ at the first power supply pin 202 as its power supply. The reset signal generating circuit 120 asserts the POR_OUT signal in response to an assertion of the TRIG signal. When the voltage $V_{DD1}$ is lower than a predetermined voltage level (minimum operation voltage) $V_{MIN}$, and accordingly, when the reset signal generating circuit 120 cannot operate normally, the reset signal generating circuit 120 is configured to negate the POR_OUT signal.

For example, an arrangement may be made in which N=2. In this case, the power-receiving circuit 210 may be configured as an interface circuit that communicates with an external circuit. Also, an arrangement may be made in which the power-receiving circuit 212_1 is configured as a digital circuit and the power-receiving circuit 212_2 is configured as an analog circuit.

The above is the basic configuration of the semiconductor device 200. The present invention encompasses various kinds of apparatuses and circuits that can be regarded as a block configuration or a circuit configuration shown in FIG. 1, or otherwise that can be derived from the aforementioned description. That is to say, the present invention is not restricted to a specific configuration. More specific description will be made below regarding an example configuration for clarification and ease of understanding of the essence of the present invention and the circuit operation. That is to say, the following description will by no means be intended to restrict the technical scope of the present invention.

Figure 2:
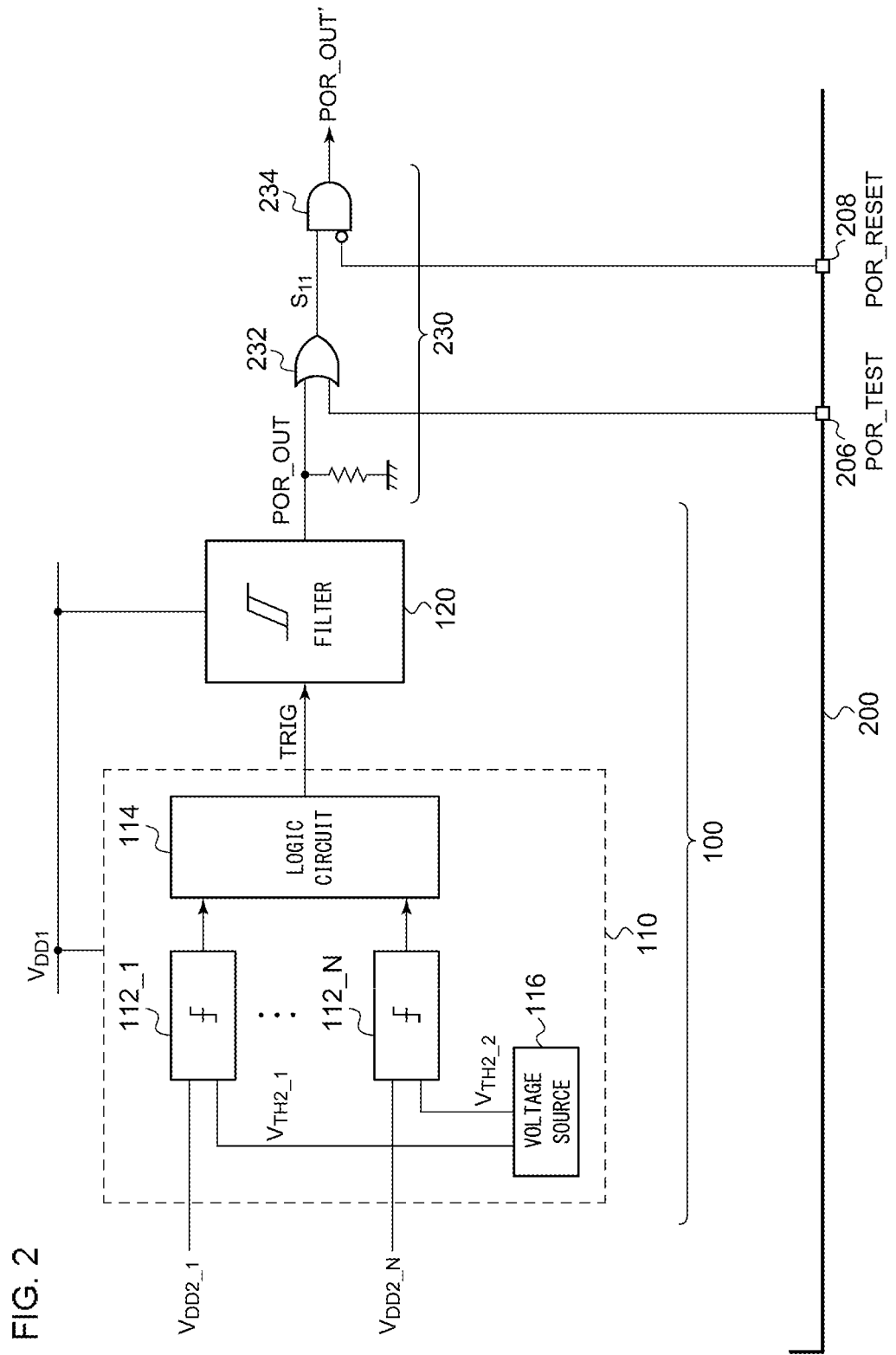
FIG. 2 is a block diagram showing an example configuration of the power-on reset circuit.

FIG. 2 is a block diagram showing an example configuration of the power-on reset circuit 100. The voltage monitoring circuit 110 includes N voltage comparators 112_1 through 112_N, a logic circuit 114, and a voltage source 116. The N voltage comparators 112_1 through 112_N are associated with the N second power supply pins 204. The i-th (i=1, 2, . . . , N) voltage comparator 112_i compares the power supply voltage $V_{DD2\_i}$ at the corresponding second power supply pin 204_i with the corresponding threshold value $V_{TH2\_i}$. When $V_{DD2\_i}$ is higher than $V_{TH2\_i}$, the i-th voltage comparator 112_i outputs a judgment signal $S_{CMPi}$, having a predetermined level (high level, for example). The threshold values $V_{TH2\_1}$ through $V_{TH2\_N}$ are generated by the voltage source 116.

The logic circuit 114 generates a TRIG signal that corresponds to the outputs of the two voltage comparators 112_1 and 112_2. Specifically, when all the outputs of the voltage comparators 112_1 through 112_N become a predetermined level, the logic circuit 114 asserts the TRIG signal.

The reset signal generating circuit 120 is preferably configured to have low-pass filter characteristics or otherwise delay characteristics. Such an arrangement is capable of preventing chattering of the POR_OUT signal even if the TRIG signal changes due to fluctuation of one or multiple power supply voltages from among the power supply voltages $V_{DD2\_1}$ through $V_{DD2\_N}$ in the vicinity of the threshold value. This provides the overall operation of the semiconductor device 200 with improved stability.

Furthermore, the reset signal generating circuit 120 is preferably configured to have hysteresis characteristics. This provides the POR_OUT signal with further improved stability. It should be noted that, in a case in which the reset signal generating circuit 120 is configured to have such hysteresis characteristics, the voltage comparators 112_1 through 112_N do not require hysteresis characteristics. This allows the voltage comparators to have a simple configuration.

The semiconductor device 200 further includes a control (POR_TEST) pin 206, a test reset (POR_RESET) pin 208, and a logic circuit 230. The control pin 206 and the test reset pin 208 are used for function verification of the semiconductor device 200 itself or otherwise an electronic device including the semiconductor device 200. The control pin 206 is configured to receive the input of the control signal POR_TEST for overriding the power-on reset circuit 100. In this example, when the POR_TEST signal is set to the high level, an output $S_{11}$ of an OR gate 232 is set to the high level regardless of the logical value of the POR_OUT signal.

The test reset pin 208 is configured to receive the input of an external reset signal POR_RESET. In the enabled state of the power-on reset circuit 100, the POR_RESET signal is set to the low level. When the external reset signal POR_RESET is asserted (set to the high level, for example) in a disabled state of the power-on reset circuit 100, the output POR_OUT' of an AND gate 234 is asserted (set to the high level).

That is to say, when the control pin POR_TEST is set to a predetermined electrical state, a signal POR_OUT' having a logical value that corresponds to the external reset signal POR_RESET is input to the first buffer and the N second buffers, instead of inputting the POR_OUT signal.

The logic circuit 230 includes a pull-down resistor 236 that pulls down the output of the reset signal generating circuit 120. This ensures that the POR_OUT signal is set to the low level when the power supply voltage $V_{DD1}$ becomes lower than the minimum circuit operation voltage.

As described above, by providing the control pin 206, the test reset pin 208, and the logic circuit 230, this makes it possible to reset each register included in the power-receiving circuit and to set each power-receiving circuit to a suspension state while maintaining the supply of the power supply voltage $V_{DD1}$ and $V_{DD2\_1}$ through $V_{DD2\_N}$ to the semiconductor device 200.

Figure 3A:
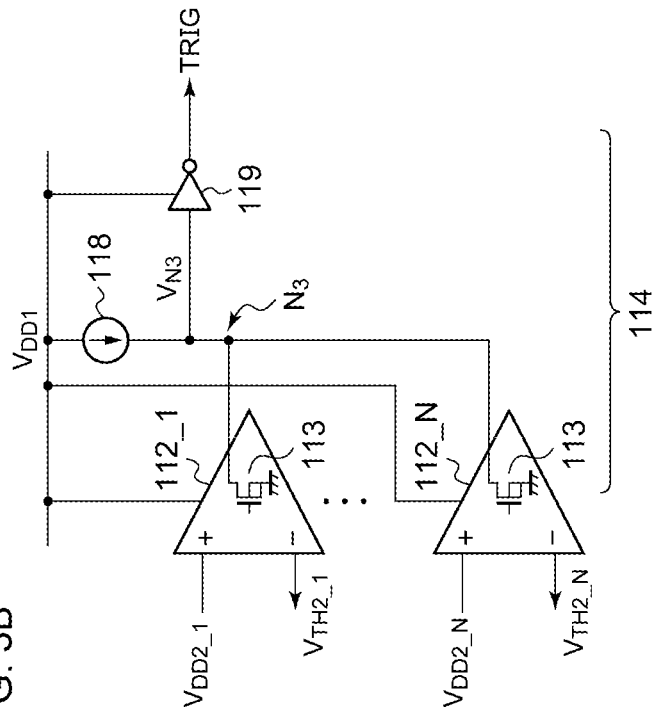
FIGS. 3A through 3C are circuit diagrams each showing an example configuration of a voltage comparator voltage monitoring circuit.
Figure 3B:
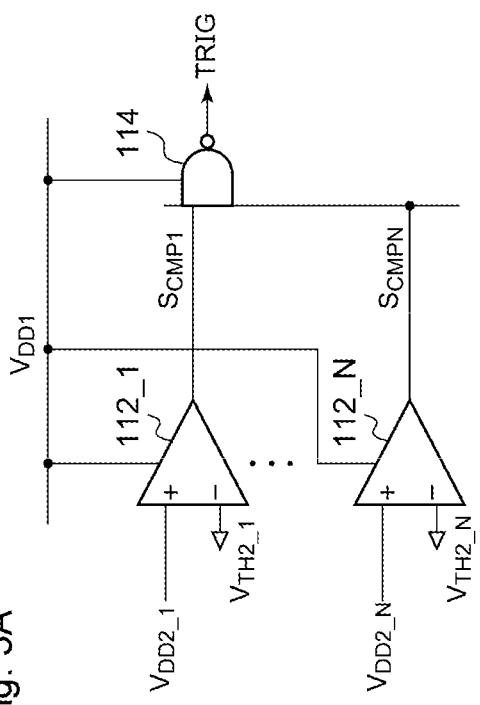
Figure 3C:
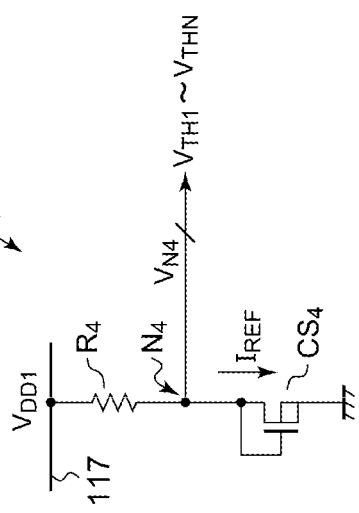

FIGS. 3A through 3C are circuit diagrams each showing an example configuration of the voltage monitoring circuit 110. Description will be made with reference to FIG. 3A. In this example, the assertion of the TRIG signal is associated with the low level. Accordingly, the logic circuit 114 may be configured as a NAND gate. It should be noted that the configuration of the logic circuit 114 is not restricted to such an arrangement. Rather, the logic circuit 114 may be configured as appropriate according to the logical levels of the input and output signals.

In an example shown in FIG. 3B, the assertion of the TRIG signal is associated with the low level. The voltage comparators 112_1 through 112_N each include an open-drain output stage or otherwise an open-collector output stage. When $V_{DD2\_i} < V_{TH2\_i}$, the output of the voltage comparator 112_i is pulled down (a transistor 113 of the output stage is turned on). Conversely, when $V_{DD2\_i} > V_{TH2\_i}$, the output of the voltage comparator 112_i is set to a high-impedance state (the transistor 113 of the output stage is turned off).

The outputs of the voltage comparators 112_1 through 112_N (namely, drains of the transistors 113) are coupled together to a common node that is pulled up to the power supply voltage $V_{DD1}$ via an impedance circuit such as the current source 118, a resistor, or the like. When all the outputs of the voltage comparators 112 transit to a high-impedance state, i.e., when the relation $V_{DD2\_i} > V_{TH2\_i}$ holds true for all the voltage comparators 112, the voltage $V_{N3}$ at a node $N_3$ is set to the high level. On the other hand, when at least one of the outputs of the voltage comparators 112 is set to a pull-down state, i.e., when the relation $V_{DD2\_i} < V_{TH2\_i}$ holds true for at least one voltage comparator, the voltage $V_{N3}$ at the node $N_3$ is set to the low level. An inverter 119 inverts the voltage $V_{N3}$ at the node $N_3$ so as to generate the TRIG signal. An open-collector output stage, a current source 118, and the inverter 119 correspond to the logic circuit 114.

FIG. 3C shows an example configuration of the voltage source 116. The voltage source 116 includes a fourth resistor $R_4$ and a current source $CS_4$. The fourth resistor $R_4$ and the current source $CS_4$ are arranged in series between a power supply line 203 coupled to the first power supply pin 202 and the ground. The voltage $V_{N4}$ at a connection node $N_4$ that connects the fourth resistor $R_4$ and the current source $CS_4$ is employed as the threshold value $V_{TH2}$. The current source $CS_4$ may be configured as an N-channel MOSFET with its drain and source coupled. In a case in which all the threshold values $V_{TH2\_1}$ through $V_{TH2\_N}$ are the same, the voltage $V_{N4}$ at the connection node $N_4$ is supplied to the multiple voltage comparators 112_1 through 112_N. In a case in which there is a difference in the threshold value between the respective voltage comparators, such a voltage source 116 may be provided for each voltage comparator. It should be noted that the configuration of the voltage source 116 is not restricted to such an arrangement. Rather, the voltage source 116 may also be configured using other known techniques.

Figure 4:
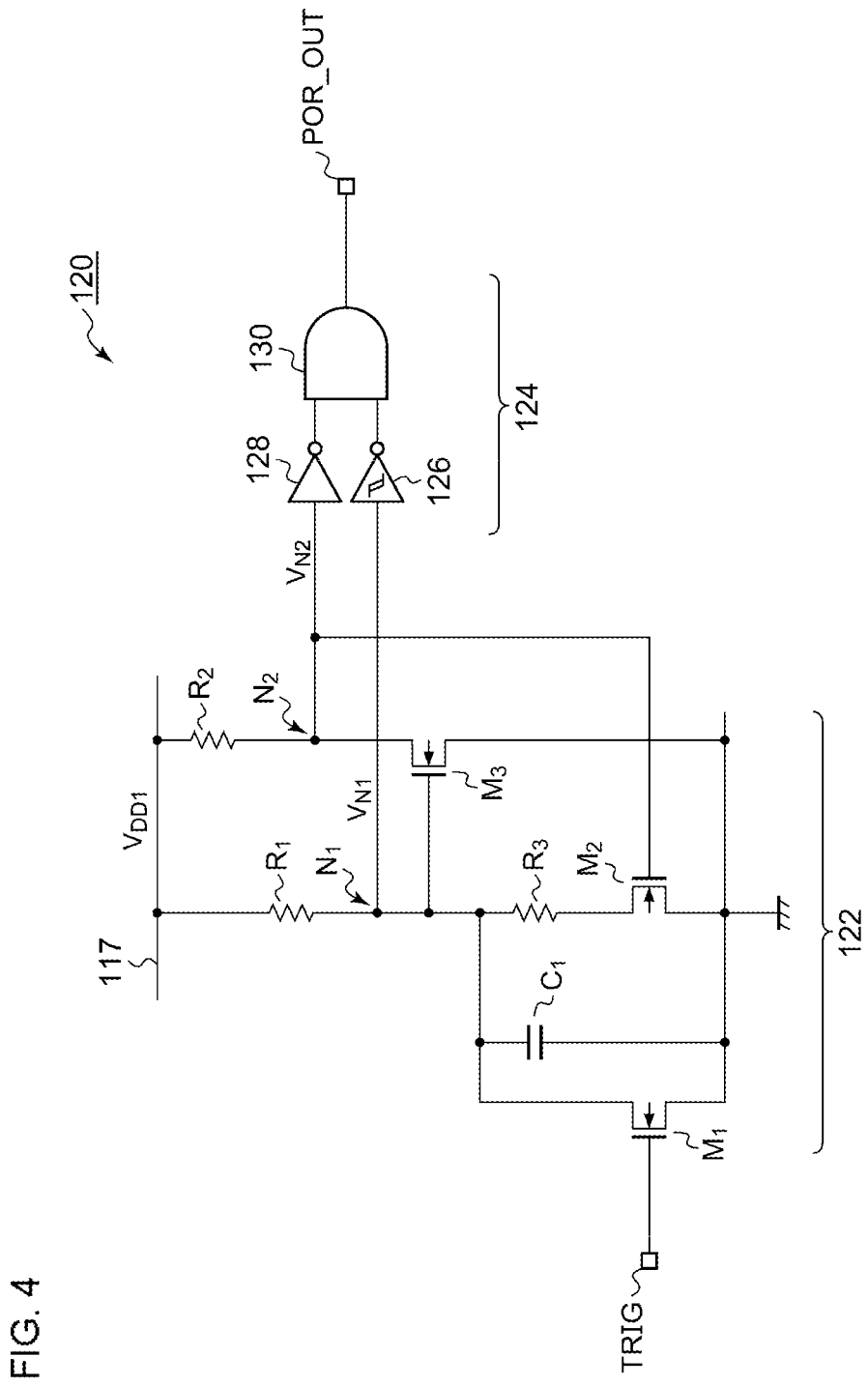
FIG. 4 is a circuit diagram showing an example configuration of a reset signal generating circuit.

FIG. 4 is a circuit diagram showing an example configuration of the reset signal generating circuit 120. The reset signal generating circuit 120 includes a CR time constant circuit (filter circuit) 122 and an output circuit 124. When the TRIG signal is asserted, the CR time constant circuit 122 generates a time constant voltage $V_{N1}$ that changes with a predetermined time constant. The output circuit 124 generates a binary POR_OUT signal having the high level or the low level based on the time constant voltage $V_{N1}$.

Description will be made regarding the CR time constant circuit 122. A first resistor $R_1$ is provided between a power supply line 117 coupled to the first power supply pin 202 and a first node $N_1$. A second resistor $R_2$ is provided between the power supply line 117 and a second node $N_2$. A capacitor $C_1$ is provided between the first node $N_1$ and the ground. A first transistor $M_1$ is coupled to the capacitor $C_1$ in parallel between the first node $N_1$ and the ground. The first transistor $M_1$ is arranged so as to receive the TRIG signal via its control terminal (gate).

When the TRIG signal is set to a negated (high level) state, the first transistor $M_1$ is turned on. In this state, the voltage $V_{N1}$ at the first node $N_1$ is set to the ground voltage. When the TRIG signal is asserted, the first transistor $M_1$ is turned off. In this state, the capacitor $C_1$ is charged via the resistor $R_1$, and accordingly, the voltage $V_{N1}$ at the first node $N_1$ rises with the CR time constant.

A second transistor $M_2$ and a third resistor $R_3$ are provided in series between the first node $N_1$ and the ground. The control terminal (gate) of the second transistor $M_2$ is coupled to the second node $N_2$. A third transistor $M_3$ is provided between the second node $N_2$ and the ground. The control terminal of the third transistor $M_3$ is coupled to the first node $N_1$.

A Schmitt buffer 126 included in the output circuit 124 receives the time constant voltage $V_{N1}$, and converts the time constant voltage $V_{N1}$ thus received into a binary value. The Schmitt buffer 126 allows the reset signal generating circuit 120 to have hysteresis characteristics, thereby providing the circuit with improved stability.

In order to provide further improved stability, an inverter 128 and an AND gate 130 may be provided. The inverter 128 converts the voltage $V_{N2}$ at the second node $N_2$ into a binary value, and inverts the binary value thus converted. The AND gate 130 generates the logical AND of the output of the Schmitt buffer 126 and the output of the inverter 128, so as to generate the POR_OUT signal.

Description will be made regarding the operation of the reset signal generating circuit 120 shown in FIG. 4. Immediately after the start-up operation of the semiconductor device 200, when the time constant voltage $V_{N1}$ is low, the third transistor $M_3$ is turned off. In this state, the voltage $V_{N2}$ at the second node $N_2$ is pulled up to the power supply voltage $V_{DD1}$. Accordingly, the output of the inverter 128 is set to the low level, which fixedly sets the POR_OUT signal to the low level. Furthermore, the second transistor $M_2$ is turned on, which provides the capacitor $C_1$ with a discharging path including the third resistor $R_3$.

After the third transistor $M_3$ is turned on due to an increase in the time constant voltage $V_{N1}$, the voltage $V_{N2}$ at the second node $N_2$ falls, which sets the output of the inverter 128 to the high level. Accordingly, the logical value of the POR_OUT signal matches the output (binary signal) of the Schmitt buffer 126 that corresponds to the time constant voltage $V_{N1}$. When the voltage $V_{N2}$ at the second node $N_2$ falls, the second transistor $M_2$ is turned off. As a result, the discharging path including the third resistor $R_3$ is disconnected.

Description will be made regarding the relation between the change in the voltage $V_{DD1}$ and the POR_OUT signal. In a case in which the voltage $V_{DD1}$ rises when the TRIG signal is set to the high level, when $V_{DD1} < V_{TH1\_ON}$, the POR_OUT signal is set to the low level (0 V). Conversely, when $V_{DD1} > V_{TH1\_ON}$, the POR_OUT signal is set to the high level (which is approximately equal to $V_{DD1}$). The threshold value $V_{TH1\_ON}$ is designed to be a voltage level that is higher than the minimum operation voltage $V_{MIN1}$.

Furthermore, in a case in which the voltage $V_{DD1}$ falls when the TRIG signal is set to the high level, when $V_{DD1} > V_{TH1\_OFF}$, the POR_OUT signal is set to the high level (which is approximately equal to $V_{DD1}$). Conversely, when $V_{DD1} < V_{TH1\_OFF}$, the POR_OUT signal is set to the low level (0 V). The threshold value $V_{TH1\_OFF}$ is designed to have a voltage level that is lower than the minimum operation voltage $V_{MIN1}$.

The above is a specific example configuration of the power-on reset circuit 100. Next, description will be made regarding the operation of the semiconductor device 200 with reference to FIGS. 5 and 6.

Figure 5:
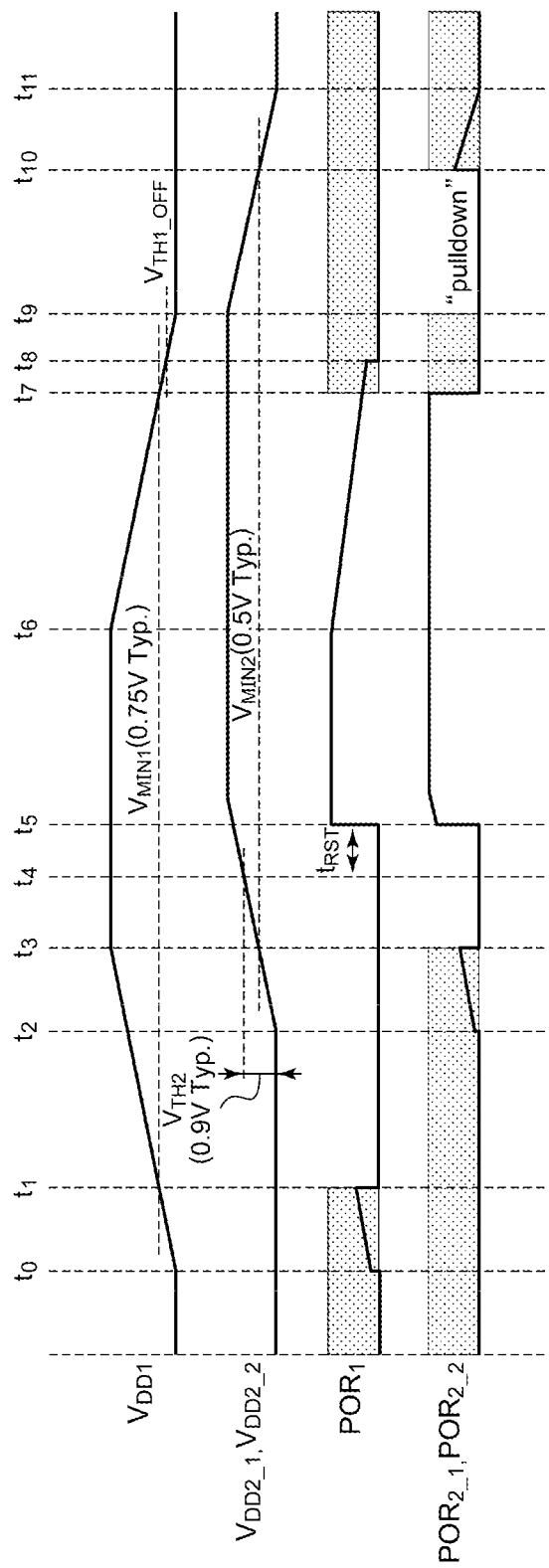
FIG. 5 is an operation waveform diagram showing the operation of a semiconductor device.

FIG. 5 is a first operation waveform diagram showing a first operation of the semiconductor device 200. Description will be made regarding an example in which N=2. In this example, first, the voltage $V_{DD1}$ supplied to the first power supply pin 202 changes, following which the power supply voltages $V_{DD2\_1}$ and $V_{DD2\_2}$ at the second power supply pins 204 change. For ease of understanding, description will be made assuming that $V_{DD2\_1} = V_{DD2\_2} = V_{DD2}$, and $V_{TH2\_1} = V_{TH2\_2} = V_{TH2}$. In the drawing, each hatched area represents a region in which the signal level is indefinite. A $VDD_1$ system (including the power-on reset circuit 100, the buffer 220, and the power-receiving circuit 210) operates with the minimum operation voltage $V_{MIN1}$ of 0.75 V. A $VDD_2$ system (including the power-receiving circuits 212 and the buffers 222) operates with the minimum operation voltage $V_{MIN2}$ of 0.5 V and $V_{TH2}$ of 0.9 V.

At the time point $t_0$, the voltage $V_{DD1}$ at the first power supply pin starts to rise. When the voltage $V_{DD1}$ is lower than the minimum operation voltage $V_{MIN1}$, the power-on reset circuit 100 and the power-receiving circuit 210 are each set to an indefinite state.

When the voltage $V_{DD1}$ exceeds the minimum operation voltage $V_{MIN1}$ at the time point $t_1$, the power-on reset circuit 100 and the power-receiving circuit 210 are each set to an operation state (activated). In this state, the relation $V_{DD2} < V_{TH2}$ holds true. Accordingly, the TRIG signal is set to the low level, which sets the POR_OUT signal to the low level. The buffer 220 is able to operate in this state. Accordingly, the setting of the $POR_1$ signal is resolved to the low level.

In this state, the voltages $V_{DD2}$ are lower than the minimum operation voltage $V_{MIN2}$. Accordingly, the buffers 222 are not able to operate. Accordingly, each $POR_2$ signal is indefinite. At the time point $t_2$, the voltages $V_{DD2}$ at the second power supply pins 204 each start to rise. When the voltages $V_{DD2}$ exceed the minimum operation voltage $V_{MIN2}$ at the time point $t_3$, the buffers 222 are set to an operable state, which resolves the setting of the $POR_2$ signals to the low level.

When the voltages $V_{DD2}$ at the second power supply pins 204 exceed the threshold value $V_{TH2}$ at the time point $t_4$, the TRIG signal is asserted. At the time point $t_5$ after a predetermined time period $t_{RST}$ elapses from the assertion of the TRIG signal, the POR_OUT signal is asserted. Here, $t_{RST}$ represents a time constant (delay time) set for the reset signal generating circuit 120. The assertion of the POR_OUT signal causes the $POR_1$ signal and the $POR_2$ signals to transit to the high level. This releases the reset state and the power-down state for the power-receiving circuit 210 and the power-receiving circuits 212.

Next, description will be made regarding a shutdown operation of the power supply.

At the time point $t_6$, the voltage $V_{DD1}$ at the first power supply pin 202 starts to fall. After the voltage $V_{DD1}$ becomes lower than the minimum operation voltage $V_{MIN1}$ of the power-on reset circuit 100 at the time point $t_6$, the buffer 220 becomes inoperable, and accordingly, the $POR_1$ signal becomes indefinite. After the voltage $V_{DD1}$ further falls and becomes lower than the threshold value $V_{TH1\_OFF}$ at the time point $t_8$, the $POR_1$ signal is set to the low level.

At the time point $t_9$, the voltages $V_{DD2}$ at the second power supply pins 204 begin to fall. During a period between the time points $t_8$ and $t_9$, the POR_OUT signal is pulled down to the low level, and accordingly, the outputs $POR_2$ of the buffers 222 are set to the low level. After the voltages $V_{DD2}$ become lower than the minimum operation voltage $V_{MIN2}$ at the time point $t_{10}$, the $POR_2$ signals become indefinite. After the voltages $V_{DD2}$ become 0 V at the time point $t_{11}$, the $POR_2$ signals are set to the low level.

Figure 6:
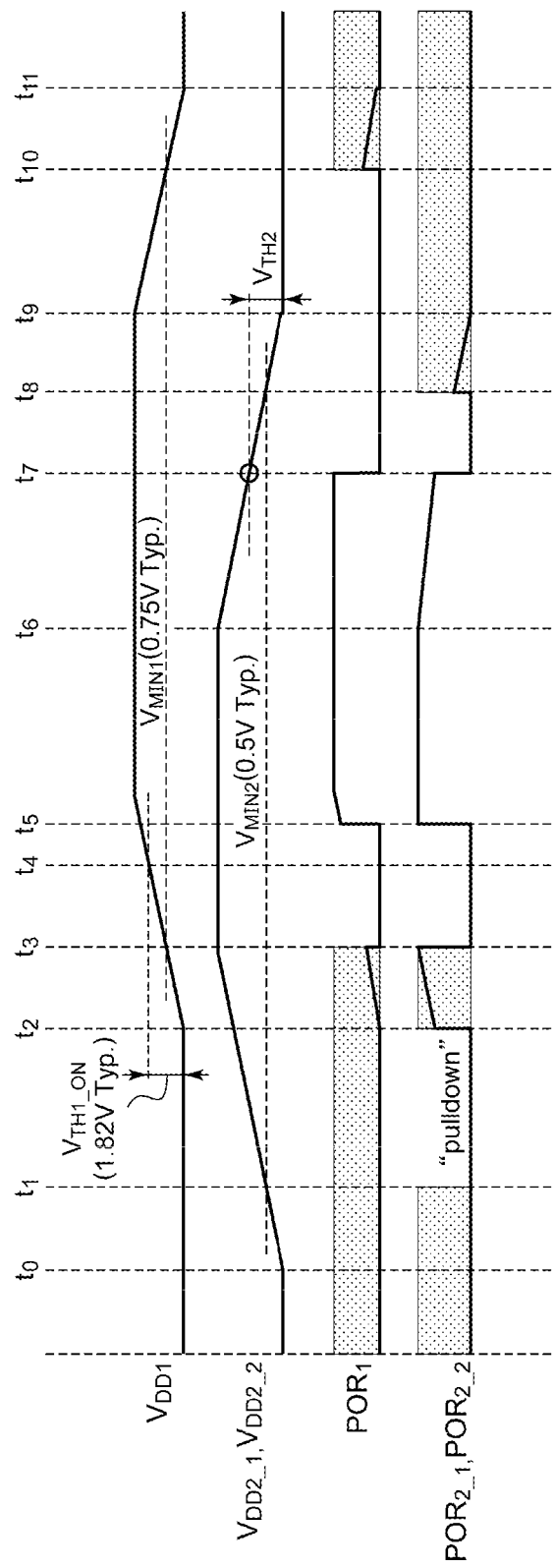
FIG. 6 is an operation waveform diagram showing the operation of a semiconductor device.

FIG. 6 is a second operation waveform diagram showing a second operation of the semiconductor device 200. In this example, first, the voltages $V_{DD2}$ supplied to the second power supply pins 204 are changed, following which the voltage $V_{DD1}$ supplied to the first power supply pin 202 is changed.

At the time point $t_0$, the voltages $V_{DD2}$ at the second power supply pins 204 start to rise. During a period between the time points $t_0$ and $t_1$, the voltages $V_{DD2}$ are lower than the minimum operation voltage $V_{MIN2}$, and accordingly, the buffers 222 are inoperable. Thus, the $POR_2$ signals are indefinite. Furthermore, the voltage $V_{DD1}$ at the first power supply pin 202 is lower than the minimum operation voltage $V_{MIN1}$, and accordingly, the buffer 220 is inoperable. Thus, the $POR_1$ signal is also indefinite.

After the voltages $V_{DD2}$ exceed the minimum operation voltage $V_{MIN2}$ at the time point $t_1$, the buffers 222 become operable. In this stage, the POR_OUT signal is pulled down to the low level. Accordingly, the setting of the $POR_2$ signals is resolved to the low level.

At the time point $t_2$, the voltage $V_{DD1}$ starts to rise. After the voltage $V_{DD1}$ becomes higher than the minimum operation voltage $V_{MIN1}$ at the time point $t_3$, the buffer 220 becomes operable, and accordingly, the setting of the $POR_1$ signal is resolved to the low level.

During a period between the time points $t_2$ and $t_3$, the power-on reset circuit 100 is inoperable, and accordingly, the TRIG signal and the POR_OUT signal are indefinite. Accordingly, the $POR_2$ signals become indefinite.

After the voltage $V_{DD1}$ exceeds the minimum operation voltage $V_{MIN1}$ at the time point $t_3$, the $V_{DD1}$ system becomes operable. In this stage, the voltages $V_{DD2}$ are higher than the threshold value $V_{TH2}$, and accordingly, the TRIG signal is set to the high level. However, the voltage $V_{DD1}$ is lower than the threshold value $V_{TH1\_ON}$, and accordingly, the POR_OUT signal is set to the low level.

After the voltage $V_{DD1}$ exceeds the threshold value $V_{TH1\_ON}$ at the time point $t_4$, the POR_OUT signal is set to the high level with a delay time, i.e., at the time point $t_5$. As a result, the $POR_1$ signal and the $POR_2$ signals transit to the high level. This releases the reset state and the power-down state for the power-receiving circuit 210 and the power-receiving circuits 212.

Next, description will be made regarding the shutdown operation of the power supply.

At the time point $t_6$, the voltages $V_{DD2}$ at the second power supply pins 204 start to fall. After the voltages $V_{DD2}$ become lower than the threshold voltage $V_{TH2}$ at the time point $t_7$, the TRIG signal and the POR_OUT signal are set to the low level. Accordingly, the $POR_1$ signal and the $POR_2$ signals each transit to the low level.

After the voltages $V_{DD2}$ at the second power supply pins 204 become lower than the minimum operation voltage $V_{MIN2}$ at the time point $t_8$, the buffers 222 become inoperable. Accordingly, the $POR_2$ signals become indefinite.

At the time point $t_9$, the voltage $V_{DD1}$ starts to fall. After the voltage $V_{DD1}$ becomes lower than the minimum operation voltage $V_{MIN1}$ at the time point $t_{10}$, the buffer 220 becomes inoperable, which causes the $POR_1$ signal to become indefinite. When the voltage $V_{DD1}$ becomes 0 V at the time point $t_{11}$, the $POR_1$ signal also becomes 0 V.

The above is the operation of the semiconductor device 200.

Next, description will be made regarding a specific example configuration of the semiconductor device 200.

Figure 7:
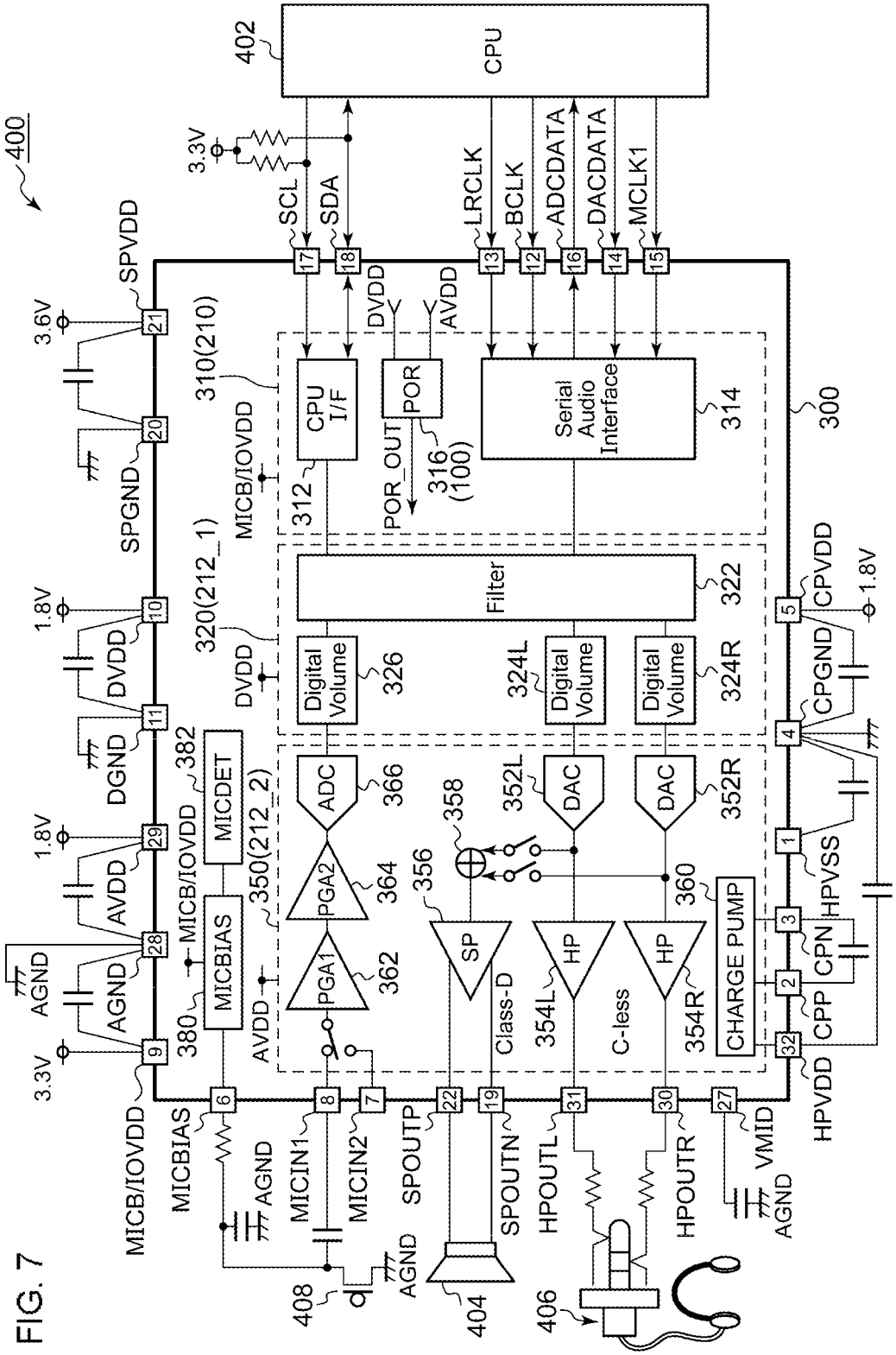
FIG. 7 is a block diagram showing an electronic device including an audio amplifier IC.

The semiconductor device 200 is configured as an audio amplifier IC 300. FIG. 7 is a block diagram showing an electronic device 400 including the audio amplifier IC 300. The electronic device 400 includes the audio amplifier IC 300, a CPU 402, a speaker 404, headphones 406, and a microphone 408.

The audio amplifier IC 300 receives a digital audio signal from the CPU 402, and converts the digital audio signal into an analog audio signal so as to drive the speaker 404 and/or the headphones 406. Furthermore, the audio amplifier IC 300 is capable of converting the output of the microphone 408 into a digital value, and of outputting the digital value thus converted to the CPU 402.

The audio amplifier IC 300 mainly includes a power-on reset circuit 316, (i) an interface circuit 310, (ii) a digital circuit 320, and (iii) an analog circuit 350. The interface circuit 310, the digital circuit 320, and the analog circuit 350, shown in FIG. 7, correspond to the power-receiving circuits 210, 212_1, and 212_2, respectively.

The interface circuit 310 includes a CPU interface 312 and an audio interface 314. The interface circuit 310 is configured with the voltage supplied via a MICB/IOVDD pin as its power supply. The MICB/IOVDD pin corresponds to the first power supply pin 202 shown in FIG. 1. The power-on reset circuit 316 corresponds to the power-on reset circuit 100 shown in FIG. 1. The CPU interface 312 supports serial communication with the CPU 402, which allows gain setting values or the like for filters or amplifiers to be received. The audio interface 314 supports serial communication with the CPU 402, which allows a digital audio signal to be received.

The digital circuit 320 is configured with the voltage at a DVDD pin as its power supply. A DGND pin is a ground pin to be paired with the DVDD pin. The DVDD pin corresponds to the second power supply pin 204_1 shown in FIG. 1. A digital filter 322 filters the audio signal received by the audio interface 314. Digital volume circuits 324L and 324R control the volumes of digital audio signals of L and R channels. A digital volume circuit 326 controls the volume of the digital audio signal generated based on the microphone input.

The analog circuit 350 is configured with the voltage at an AVDD pin as its power supply. An AGND pin is a ground pin to be paired with the AVDD pin and the MICB/IOVDD pin. The AVDD pin corresponds to the second power supply pin 204_2 shown in FIG. 1. D/A converters 352L and 352R convert digital audio signals of the L and R channels into analog audio signals. Headphone amplifiers 354L and 354R drive the headphones 406 according to the analog audio signals received from the D/A converters 352L and 352R. An adder (mixer) 328 converts the audio signals of the two channels L and R into a monaural signal. A speaker amplifier 356 is configured with the voltage supplied via an SPVDD pin as its power supply, and drives the speaker 404. A charge pump circuit 360 is configured with the voltage at a CPVDD pin as its input, and generates positive and negative power supply voltages HPVDD and HPVSS to be supplied to the headphone amplifiers 354L and 354R.

Programmable gain amplifiers (PGA) 362 and 364 amplify a signal input from the microphone 408 via a MICIN1 (MICIN2) pin. An A/D converter 366 converts the output of the programmable gain amplifier 364 into a digital value.

A microphone bias circuit 380 and a microphone detector 382 are configured with the voltage supplied via a MICB/IOVDD pin as their power supply. The microphone bias circuit 380 supplies a bias voltage to the microphone 408 via a MICBIAS pin. The microphone detector 382 detects whether or not the microphone 408 has been connected.

A POR circuit 316 is configured with the voltage supplied via the MICB/IOVDD pin as its power supply. The POR circuit 316 is capable of monitoring the voltages applied to the DVDD pin, AVDD pin, SPVDD pin, and CPVDD pin, which correspond to $V_{DD2\_1}$ through $V_{DD2\_N}$. The POR circuit 316 generates a POR_OUT signal. When the POR_OUT signal is asserted, the interface circuit 310 is reset. During a period in which the POR_OUT signal is negated, the analog circuit 350 is set to a suspension state (power-down state). When the POR_OUT signal is asserted, the analog circuit 350 starts to operate. When the POR_OUT signal is asserted, the filter parameters, the gain of the digital volume circuit 324, etc., are reset.

While the preferred embodiments of the present invention have been described using specific terms, such description is for illustrative purposes only, and it is to be understood that changes and variations may be made without departing from the spirit or scope of the appended claims.

What is claimed is:

1. A power-on reset circuit to be provided to a semiconductor device comprising a first power supply pin and one or more N second power supply pins, the power-on reset circuit comprising:

a voltage monitoring circuit structured to operate with a voltage at the first power supply pin as a power supply thereof, to compare each from among voltages supplied to the N second power supply pins with a corresponding threshold value, and to assert a trigger signal when the supplied voltage exceeds a corresponding threshold value for all the second power supply pins; and a reset signal generating circuit structured to operate with the voltage at the first power supply pin as a power supply thereof, and to assert a reset signal in response to an assertion of the trigger signal, wherein the voltage monitoring circuit comprises N voltage comparators that correspond to the respective N second power supply pins, and that are each structured to compare a power supply voltage at the corresponding second power supply pin with a corresponding threshold value, wherein N is equal to or greater than 2, wherein the voltage monitoring circuit further comprises a logic circuit structured to generate the trigger signal that corresponds to outputs of the N voltage comparators, wherein the N voltage comparators each comprise an open-drain output stage or otherwise an open-collector output stage, wherein the logic circuit comprises a current source or otherwise an impedance circuit coupled to a common output node of the outputs of the N voltage comparators, and is structured to generate the trigger signal that corresponds to an output of the common output node of the N voltage comparators.

2. The power-on reset circuit according to claim 1, wherein the reset signal generating circuit comprises a CR (capacitance resistance) time constant circuit.

3. A power-on reset circuit to be provided to a semiconductor device comprising a first power supply pin and one or more N second power supply pins, the power-on reset circuit comprising:

a voltage monitoring circuit structured to operate with a voltage at the first power supply pin as a power supply thereof, to compare each from among voltages supplied to the N second power supply pins with a corresponding threshold value, and to assert a trigger signal when the supplied voltage exceeds a corresponding threshold value for all the second power supply pins; and a reset signal generating circuit structured to operate with the voltage at the first power supply pin as a power supply thereof, and to assert a reset signal in response to an assertion of the trigger signal, wherein the reset signal generating circuit comprises:

a first node;

a second node;

a first resistor provided between a power supply line coupled to the first power supply pin and the first node;

a second resistor provided between the power supply line and the second node;

a capacitor provided between the first node and a ground;

a first transistor coupled with the capacitor in parallel between the first node and the ground, and structured to receive the trigger signal via a control terminal thereof;

a second transistor provided with a third resistor coupled in series between the first node and the ground, and arranged such that a control terminal thereof is coupled to the second node;

a third transistor provided between the second node and the ground, and arranged such that a control terminal thereof is coupled to the first node; and an output circuit structured to generate the reset signal that corresponds to a voltage at the first node.

4. The power-on reset circuit according to claim 3, wherein the output circuit further comprises a Schmitt buffer structured to receive the voltage at the first node.

5. The power-on reset circuit according to claim 1, wherein N is equal to or greater than 2, wherein the N threshold values that correspond to the N second power supply pins are equal to each other, wherein the power-on reset circuit comprises a fourth resistor and a current source provided in series between a power supply line coupled to the first power supply pin and a ground, and wherein a voltage at a connection node that connects the fourth resistor and the current source is used as the common threshold value.

6. The power-on reset circuit according to claim 5, wherein the current source comprises an N-channel MOSFET arranged such that a source thereof is grounded and a gate and a drain thereof are coupled.

7. A semiconductor device comprising the power-on reset circuit according to claim 1.

8. A semiconductor device comprising:

a first power supply pin;

one or more N second power supply pins;

an interface circuit structured to operate receiving a voltage at the first power supply pin;

N power-receiving circuits provided corresponding to the N second power supply pins;

a power-on reset circuit structured to assert a reset signal when a predetermined voltage is supplied to all the first power supply pin and the N second power supply pins;

a first buffer structured to supply the reset signal to the interface circuit; and N second buffers structured to supply the reset signals to the N power-receiving circuits, wherein the power-on reset circuit comprises:

a voltage monitoring circuit structured to operate with a voltage at the first power supply pin as a power supply thereof, to compare the voltage supplied to each of the N second power supply pins with a corresponding threshold value, and to assert a trigger signal when the supplied voltage exceeds the corresponding threshold value for all the second power supply pins; and a reset signal generating circuit structured to operate with the voltage at the first power supply pin as a power, supply thereof, and to assert a reset signal when an assertion of the trigger signal continues for a predetermined period of time, wherein the voltage monitoring circuit comprises N voltage comparators that correspond to the respective N second power supply pins, and that are each structured to compare a power supply voltage at the corresponding second power supply pin with a corresponding threshold value, wherein N is equal to or greater than 2, wherein the voltage monitoring circuit further comprises a logic circuit structured to generate the trigger signal that corresponds to outputs of the N voltage comparators, wherein the N voltage comparators each comprise an open-drain output stage or otherwise an open-collector output stage, and wherein the logic circuit comprises a current source or otherwise an impedance circuit coupled to a common output node of the outputs of the N voltage comparators, and is structured to generate the trigger signal that corresponds to an output of the common output node of the N voltage comparators.

9. The semiconductor device according to claim 8, further comprising:
- a control pin structured to override the power-on reset circuit; and
- a test reset pin structured to allow an external reset signal to be received,
- wherein, when the control pin is set to a predetermined electrical state, a signal that corresponds to the external reset signal is input to the first buffer and the N second buffers instead of inputting the reset signal.

10. The semiconductor device according to claim 8, wherein the semiconductor device is structured as an audio amplifier circuit,
- wherein the interface circuit comprises a reception circuit structured to receive a digital audio signal from an external processor,
- wherein one of the N power-receiving circuits comprises a digital signal processing circuit structured to perform signal processing for the digital audio signal,
- and wherein another one of the N power-receiving circuits comprises a D/A converter structured to convert the digital audio signal subjected to the processing by means of the digital signal processing circuit into an analog audio signal, and an amplifier structured to amplify the analog audio signal.

11. The semiconductor device according to claim 8, wherein the reset signal generating circuit comprises a CR time constant circuit.

12. The semiconductor device according to claim 8, wherein the reset signal generating circuit comprises:
- a first node;
- a second node;
- a first resistor provided between a power supply line coupled to the first power supply pin and the first node;
- a second resistor provided between the power supply line and the second node;
- a capacitor provided between the first node and a ground;
- a first transistor coupled with the capacitor in parallel between the first node and the ground, and structured to receive the trigger signal via a control terminal thereof;
- a second transistor provided with a third resistor coupled in series between the first node and the ground, and arranged such that a control terminal thereof is coupled to the second node;
- a third transistor provided between the second node and the ground, and arranged such that a control terminal thereof is coupled to the first node; and
- an output circuit structured to generate the reset signal that corresponds to a voltage at the first node.

13. The semiconductor device according to claim 8, wherein N is equal to or greater than 2,
- wherein the N threshold values that correspond to the N second power supply pins are equal to each other,
- wherein the power-on reset circuit comprises a fourth resistor and a current source provided in series between a power supply line coupled to the first power supply pin and a ground,
- and wherein a voltage at a connection node that connects the fourth resistor and the current source is used as the common threshold value.

14. An electronic device comprising:
- the semiconductor device according to claim 8; and
- a power supply circuit structured to supply a power supply voltage to the first power supply pin and the N second power supply pins of the semiconductor device.

15. The power-on reset circuit according to claim 3, wherein N is equal to or greater than 2,
- wherein the N threshold values that correspond to the N second power supply pins are equal to each other,
- wherein the power-on reset circuit comprises a fourth resistor and a current source provided in series between a power supply line coupled to the first power supply pin and a ground,
- and wherein a voltage at a connection node that connects the fourth resistor and the current source is used as the common threshold value.

16. The power-on reset circuit according to claim 15, wherein the current source comprises an N-channel MOSFET arranged such that a source thereof is grounded and a gate and a drain thereof are coupled.

17. A semiconductor device comprising the power-on reset circuit according to claim 3.

* * * * *